United States Patent [19]

Haussmann

[11] Patent Number: 4,567,442
[45] Date of Patent: Jan. 28, 1986

[54] METHOD AND APPARATUS FOR DEMODULATING TIME-DISCRETE FREQUENCY-MODULATED SIGNALS

[75] Inventor: Wolfgang Haussmann, Munich, Fed. Rep. of Germany

[73] Assignee: Siemens Aktiengesellschaft, Berlin and Munich, Fed. Rep. of Germany

[21] Appl. No.: 441,856

[22] Filed: Nov. 15, 1982

[30] Foreign Application Priority Data

Nov. 19, 1981 [DE] Fed. Rep. of Germany ....... 3145919

[51] Int. Cl.⁴ ............................................. H03D 1/00
[52] U.S. Cl. .................................. 329/145; 329/137; 375/80
[58] Field of Search ................ 307/261, 358; 329/137, 329/145, 110; 375/80, 82; 455/214, 337

[56] References Cited

U.S. PATENT DOCUMENTS 3,944,931 3/1976 Usami et al. ..................... 329/137 X
4,064,408 12/1977 Hon et al. ........................ 307/358 X
4,431,916 2/1984 Couch ............................. 307/358 X

FOREIGN PATENT DOCUMENTS 0041162 4/1978 Japan ................................... 329/145
0027753 2/1980 Japan ..................................... 375/82

OTHER PUBLICATIONS

Manes, G. F., "Experiments on Variable Delay and Time Base Variation Using a Programmable SAW Device", IEEE, 1977, Ultrasonics Symposium Proceedings, pp. 619–622, (Phoenix, AZ, USA, Oct. 26-28 77) (Catalog #77CH1264–ISU).

Primary Examiner—Eugene R. LaRoche
Assistant Examiner—Robert J. Pascal
Attorney, Agent, or Firm—Herbert L. Lerner; Laurence A. Greenberg

[57] ABSTRACT

Method for demodulating time-discrete frequency-modulated signals. The method includes combining sequential equidistant samples of a signal to be demodulated for deducing the instantaneous frequency of the signal to be demodulated. The improvement includes dividing a first vector sum of samples forming a dividend by a second vector sum of samples forming a divisor. Each sample is a complex number represented by a vector. The vector sum of the dividend has a phase that is offset from the vector sum of the divisor by a phase angle equal to n times pi, wherein n is any integer. The division of the vector sums is advantageously performed by a ROM in which all the division results have been stored and which can be accessed by the divisor and the dividend for quickly obtaining the division result. Delay lines and summing circuits are used for combining the samples into the dividend and the divisor.

4 Claims, 5 Drawing Figures

METHOD AND APPARATUS FOR DEMODULATING TIME-DISCRETE FREQUENCY-MODULATED SIGNALS

BACKGROUND IF THE INVENTION

The invention relates to a method and an apparatus for demodulating time-discrete sampled frequency-modulated signals wherein samples of the signal to be demodulated are combined in such a way that the instantaneous frequency of the signal to be demodulated can be inferred from the output signal.

Digital signal processing makes it possible to tackle digitally numerous problems of signal processing which have previously been solved in analog technology. However, there are several exceptions. Thus, heretofore, in connection with demodulators for frequency-modulated signals (FM signals) used in analog technology, no corresponding digital component has been described which could carry out the function of FM demodulation at reasonable cost and in real time. Several possibilities resembling digital methods have proved unsuitable in practice. Thus, zero-crossing detectors are not very suitable, because the zero crossings are lost due to the necessarily performed sampling process. The desirable procedure would therefore be processing of the sampled values with the functions of an FM demodulator, while effects of amplitude modulation are suppressed or limited.

Specifically, several possibilities exist for the demodulation of time-discrete frequency-modulated signals:

PRIOR ART

Use of a digital phase control loop (cf. an article by Kelly and Gupta entitled: "The Digital PLL as a Near-Optimum FM-Demodulator", IEEE Transaction on Communication, June 1972) and the method of using a guided adaptive filter (cf. an article by Griffiths entitled: "Rapid Measurement of Digital Instantaneous Frequency", IEEE Transactions of Acoustics, Speech and Signal Processing, April 1975, pages 207 to 221) leads to control circuits with the problems connected therewith regarding, for example, transient response, stability, and so forth.

The rapid Fourier transformation also considered before (cf. an article by Roth entitled: "Effective Measurements Using Digital Signal Analysis", IEEE Spectrum, April 1971, pages 62 to 70) requires a comparatively high cost of computation for the demodulation, so that real-time processing is limited primarily to the range of low carrier frequencies. Hence all methods discussed hereinbefore require high cost with respect to system development and the manufacture of the respective components.

It would furthermore be conceivable to transform the frequency modulated signal into an amplitude modulated signal and then demodulate the amplitude modulated signal. There are indeed various possibilities for transforming a frequency modulated signal into an amplitude modulated signal. However, problems connected with digital amplitude demodulation and digital limitation have not yet been solved.

SUMMARY OF THE INVENTION

It is accordingly an object of the invention to provide a method and apparatus for the demodulation of time-discrete sampled frequency-modulated signals which are present as sampled values, that overcome the hereinafore-mentioned disadvantages of the heretofore-known methods and devices of this general type.

In U.S. patent application Ser. No. 715,518 which is a continuation-in-part of patent application Ser. No. 627,495, which is a continuation of patent application Ser. No. 290,330, now abandoned, a method is proposed for demodulating time-discrete frequency-modulated signals wherein the signal to be demodulated is passed through delay elements and wherein three samples of the signal to be demodulated are combined in such a way that the output signal is directly proportional to the instantaneous frequency which contains the three samples. This can be achieved since the samples are added at times T and $T+2T_A$ ($T_A$=clock period), and the sum is divided by a value proportional to the sample at time $T+T_A$.

In order to reduce disturbing influences, and to adapt the properties of an FM modulator according to the instant disclosure to a practical realization and to provide better flexibility in the layout of an apparatus for demodulating time-discrete frequency-modulated signals, it is also the object of the invention to provide a number of additional possibilities for carrying out the demodulation of sampled FM signals which are equidistant in time.

With the foregoing and other objects in view there is provided, in accordance with the invention, a method for demodulating time-discrete frequency-modulated signals, which includes combining samples of a signal to be demodulated for deducing the instantaneous frequency of the signal to be demodulated, wherein the improvement comprises dividing a first weighted sum of samples forming a dividend by a second weighted sum of samples forming a divisor to obtain an output signal, and selecting the samples equidistantly when representing the samples in a vector diagram in which each sample is a complex number represented by a vector, and wherein the vector sum of the dividend has a phase position corresponding to a phase position of the vector sum of the divisor by a factor $n \times \pi$, where $n = 0, 1, 2 \ldots$.

It is thus possible to provide a plurality of possibilities in which the result of the demodulation is independent of the amplitude of the sampled signal (limitation) and independent of the phase position of the sampling frequency.

There is also provided an apparatus for demodulating a time-discrete sampled frequency-modulated signal, comprising a series connection of a number of delay elements for combining a number of samples of time-discrete signals to be demodulated, wherein the series connection has an input for receiving the time-discrete sampled signals to be demodulated and wherein, the number of delay elements are selected according to the number of samples, and wherein a divider which has at least one input and an output for providing a signal for deducing the instantaneous frequency of the time-discrete signal to be demodulated, "and wherein" the divider which produces the output signal by dividing a first weighted sum of samples forming a dividend by a second weighted sum of samples forming a divisor, the samples being equidistant when represented in a vector diagram in which each sample is a complex number representing a vector and wherein the vector sum of the dividend has a phase position which is equal to the phase position of the vector sum of the divisor multiplied by the factor $n \times \pi$, where $n = 0, 1, 2 \ldots$, and a plurality of adders connected between the delay elements and the at least one input of the divider for producing the weighted sums.

In accordance with a concomitant feature of the invention, the value of the divider is obtained from read-only memory.

Other features which are considered as characteristic for the invention are set forth in the appended claims.

Although the invention is illustrated and described herein as embodied in a method and apparatus for demodulating time-discrete frequency-modulated signals, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

BRIEF DESCRIPTION OF THE DRAWINGS

Referring now to the figures of the drawings in which like elements are designated by the same reference symbols, and first particularly to FIG. 1 thereof, there is seen a sinusoidal frequency modulated signal 1 to be demodulated. The analog frequency-modulated signal 1 is sampled at time-equidistant intervals (at clock period $T_A$) and transformed into three time-discrete samples A1, A2 and A3. In FIG. 1, the three samples $A_1$, $A_2$ and $A_3$, emphasized by circles are entered, it being understood here and in the following description that a sample $A_i$ refers to a sample sampled at a time $(i-1) T_A$ later than the sample $A_1$.

DETAILED DESCRIPTION OF THE PREFERRED EMBODIMENTS

The demodulation method described in U.S. patent application, Ser. No. 715,518 which is a continuation-in-part of U.S. patent application Ser. No. 627,495, which is a continuation of U.S. patent application Ser. No. 290,330, now abandoned, filed Aug. 5, 1981 is based on the fact that the frequency f (instantaneous frequency) of the three samples $A_1$, $A_2$, $A_3$ can be approximately determined by means of the rule:

$$f = C_1 \times \frac{A_1 + A_3}{2A_2} \tag{1}$$

where f=¼, ⅜, 5/4 ... of the sampling clock frequency $1/T_A$, or exactly determined as an analytically derivable formula:

$$f = C_2 \times \arccos \frac{A_1 + A_3}{2A_2} \tag{2}$$

wherein $C_1$ and $C_2$ are constants.

Figure 6:
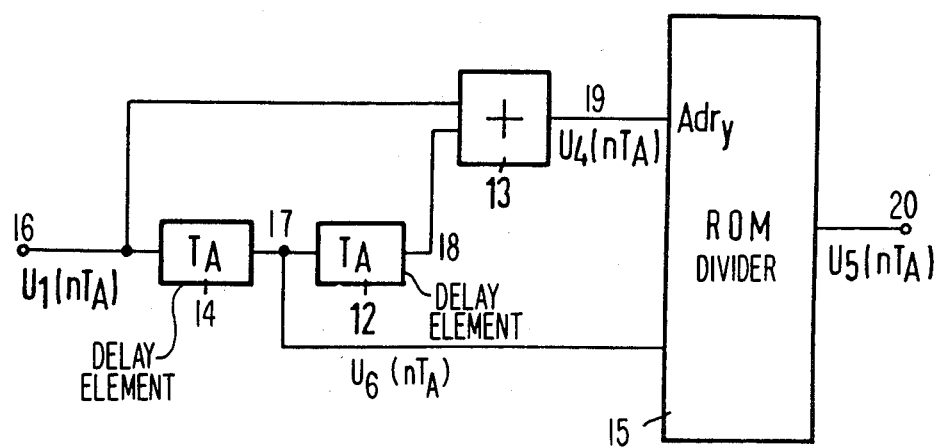
FIG. 6 shows sample apparatus of prior art referenced in aforesaid U.S. patent application Ser. No. 290,330.

In order to reduce this method to practice, U.S. patent application Ser. No. 715,518 which is a continuation-in-part of U.S. patent application Ser. No. 627,495, which is a continuation of U.S. patent application Ser. No. 290,330, now abandoned provides a circuit configuration seen in FIG. 6 wherein, connected to the input for the time-discrete signal U1 to be demodulated, on one hand, is a delay element 14 and, on the other hand, an adder 13 is connected, and wherein an additional delay element 12 is disposed between the delay element 14 and the adder 13 wherein furthermore the junction U6 between the two delay elements 14 and 12 and the output U4 of the adder 13 is connected with a read-only memory 15, and wherein additionally the demodulated signal U5 is present at the output of the read-only memory 15 in which the division and the formation of the arc cosine function is performed. Since each delay element performs a delay by one clock period $T_A$, at the output of the adder is the sum of the undelayed input signal U1 and the input signal delayed by two clock periods $T_A$ shown as reference numeral 18. Hence the read-only memory 15, or optionally a divider provided instead of the read-only memory, can divide the sum of the samples $A_1$ and $A_3$ by the sample value of $A_2$.

The demodulation characteristic, which represents the course of the output voltage of the read-only memory or of the divider as a function of the instantaneous frequency f of the FM signal to be demodulated, is produced by forming the arc cosine function, from straight line sections in the form of a triangle. If formation of the arc cosine function is dispensed with, the demodulation characteristic is instead a cosine function which, for FM signals in the range of about 0.25 times and 0.75 times the sampling frequency, is sufficiently linear.

Figure 1:
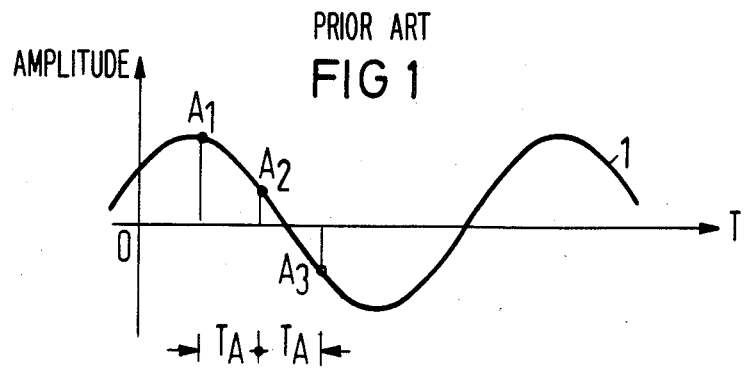
FIG. 1 is an explanatory graphical illustration of a sinusoidal input signal to be demodulated showing three consecutive time samples of the signal.
Figure 2:
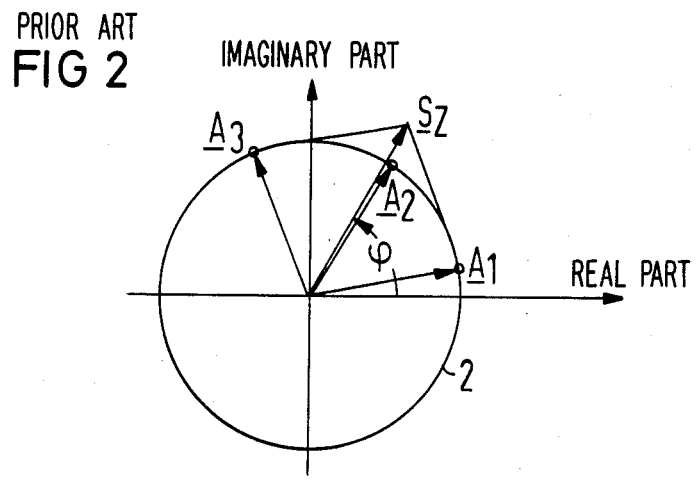
FIG. 2 is a graph of the signal of FIG. 1 in complex representation (vector diagram)

Proceeding from the analytically derivable formulas (1) and (2) above, further studies have shown that according to the invention a plurality of additional possibilities exist for carrying out the task of demodulation of approximately sinusoidal FM signals sampled at equidistant time intervals. For this purpose, the signal 1 of FIG. 1 is plotted according to FIG. 2 in complex vector representation. A corresponding complex representation of alternating current quantities in the "vector diagram" is customary in complex a-c computation and is known e.g. in the publication: Fachlexikon ABC Physik, Volume 1, published by Harri Deutsch, Zürich and Frankfurt a. M., 1974 pages 280 and 281. The cosine signal of FIG. 1 becomes a circle 2 in FIG. 2, on the arc of which the samples are located. The real part of a point on the arc 2 corresponds to a point on the cosine function 1 of FIG. 1 projected onto the amplitude axis of FIG. 1.

In complex representation, vectors $\underline{A}_1$, $\underline{A}_2$ and $\underline{A}_3$ can be plotted from the center 0 to the end of the samples.

Furthermore, the vector sum $S_Z$ of the vectors $\underline{A}_1$ and $\underline{A}_3$ can be entered, which in equation (1) forms the dividend of the fraction. It is seen that in FIG. 2 the vector sum $S_Z$ has the same phase position $\phi$ (phi) as the vector of the denominator $2 \times \underline{A}_2$ of equation (1); phase position being understood to be the angle $\phi$ formed by the real axis and the vectors $\underline{A}_2$ or $S_Z$, respectively.

Further studies have shown that additional operational demodulation methods exist, especially when using more than three samples. It is then possible, when demodulating, to reduce disturbing noise influences, to construct demodulators with specific properties (characteristics), and to manufacture the apparatus for demodulating in such a way that it is more flexible, e.g. requiring fewer bits for processing.

All operational demodulation methods according to the invention are performed in such a way that the first weighted sum of samples forming the dividend is divided by a second weighted sum of samples forming the divisor. It suffices to fulfill the condition that the vector sum of the samples forming the dividend has the same phase position or one different by $n \times \pi$ (pi) (n being an integer) in relation to the vector sum of the samples forming the denominator.

If a certain selection of samples for the dividend and divisor is to be plotted in the vector diagram, it does not matter in which phase position $\phi$ the first vector $\underline{A}_1$ is formed, when the vector diagram is drawn. The only essential condition is that the phase positions of equidistant samples succeeding one another in time differ by constant phase differences caused by samling with a constant clock period.

Figure 3:
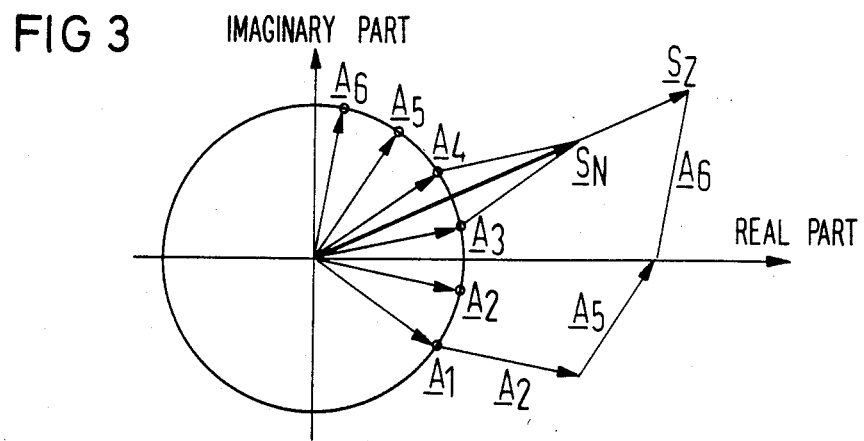
FIG. 3 is a graph of an additional complex representation of an example of the sample selection according to the invention which shows six consecutive samples of a signal to be demodulated.

FIG. 3 shows the complex representation of an operational example with four samples ($A_1$, $A_2$, $A_5$, $A_6$) in the dividend and two samples ($A_3$, $A_4$) in the divisor; wherein sample $A_2$ has been obtained one clock period $T_A$ later than sample $A_1$, etc. . . . In this example the dividend is formed of the sum of the samples $A_1$, $A_2$, $A_5$ and $A_6$. The divisor is formed of the sum of the samples $A_3$ and $A_4$. As is shown in FIG. 3, the vector sum of the dividend $S_Z$, which corresponds to a vector addition of the vectors, $\underline{A}_1$, $\underline{A}_2$, $\underline{A}_5$, $\underline{A}_6$ corresponding to the samples $A_1$, $A_2$, $A_5$ and $A_6$, results in the same phase position as the vector sum $S_N$ of the divisor, which sum is formed by addition of the vectors $\underline{A}_3$ and $\underline{A}_4$. As long as the phase positions of the vector sums of dividend and divisor correspond to the hereinabove stated requirement that divisor and dividend are separated only by $n \cdot \pi$, wherein n is any integer, the amplitude weighting of the individual sums of the dividend and the divisor is arbitrary. By means of the arbitrary selection of the amplitude weighting factors, the amplitude of the demodulation characteristic can be changed or the entire demodulation characteristic can be shifted along the amplitude axis, but its basic form remains unchanged.

Examples for operational demodulation methods wherein a first weighted sum of samples Z is divided by a second weighted sum of samples N, the samples being selected so that the vector sum of dividend Z and of divisor N have phase positions which are identical or differ only by $n \times \pi$, are:

$Z = A_1 + A_2 + A_3$, $N = A_2$;

$Z = 2 \times A_1 + 2 \times A_3$, $N = A_2$;

$Z = A_1 + A_4$, $N = A_2 + A_3$;

$Z = 2 \times A_1 + A_2 + A_3 + 2 \times A_4$, $N = A_2 + A_3$;

$Z = A_1 + 2 \times A_2 + A_3 + 2 \times A_4 + A_5$, $N = A_2 + 2 \times A_3 + A_4$.

Figure 4:
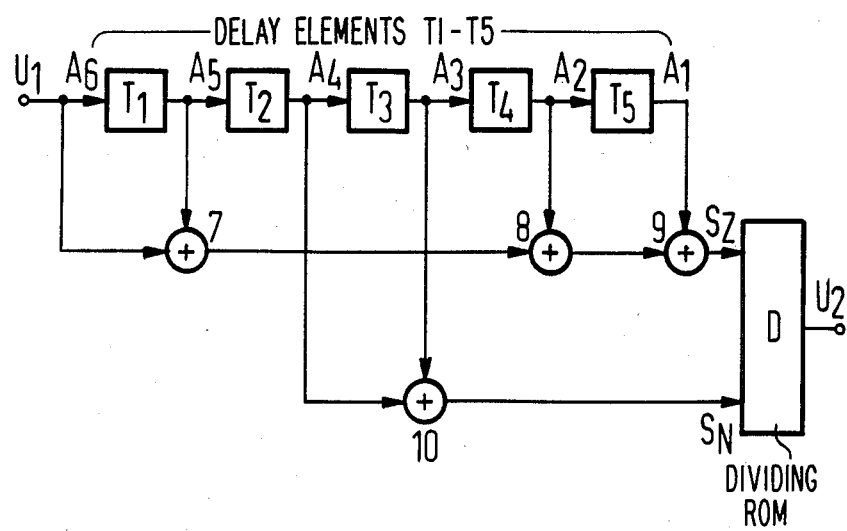
FIG. 4 is a diagrammatic and schematic block circuit diagram of an embodiment of an apparatus according to the invention.

FIG. 4 shows an embodiment for an apparatus for carrying out the method of the invention. In the embodiment according to FIG. 4, six samples $A_1$ to $A_6$ are linked in the manner corresponding to FIG. 3; that is, the dividend is formed by the sum of the samples $A_1$, $A_2$, $A_5$ and $A_6$, and the divisor by the sum of the samples $A_3$ and $A_4$. The apparatus includes a series connection of five delay elements $T_1$, $T_2$, $T_3$, $T_4$ and $T_5$, each delay element delaying the input signal applied to it by one period of the clock frequency $T_A$. At the input of the first delay element $T_1$, the time-discrete frequency-modulated signal $U_1$ to be demodulated is present. For the division of dividends by the divisor, a divider D is provided, which divides the dividend $S_Z$ by the divisor $S_N$ and gives as result the demodulated signal $U_2$ on the output side.

For summation, four adders 7, 8, 9 and 10 are provided. The first adder 7 is connected at a first input thereof with an input A6 of the delay element $T_1$ and a second input thereof is connected to an output A5 of the delay element $T_1$. The second adder 8 is connected at a first input thereof with an output of the first adder 7 and is connected at a second input thereof with an output A2 of the fourth delay element $T_4$, while the third adder 9 is connected at a first input thereof with an output of the second adder 8 and is connected at a second input thereof with an output A1 of the fifth delay element $T_5$. The dividend $S_Z$ present at an output of the third adder 9 presents a signal to the divider D. A first input of the fourth adder 10 is connected to an output of the second delay element $T_2$, while a second input of the fourth adder 10 is connected to an output A3 of the third delay element $T_3$. The divisor $S_N$, which also engages the divider D, can be tapped from the output of the fourth adder 10.

The apparatus operates as follows:

If a sample $A_1$ is applied at the output of the fifth delay element $T_5$ as illustrated in FIG. 4, then the sample $A_2$ is present at the output of the fouth delay element $T_4$, the sample $A_3$ is present at the output of the third delay element $T_3$, the sample $A_4$ is present at the output of the second delay element $T_2$, the sample $A_5$ is present at the output of the first delay element $T_1$ and the sample $A_5$ is present at the input of the first delay element $T_1$. The adders 7, 8 and 9 thus form the sum $A_6 + A_5 + A_2 + A_1$ (dividend), while adder 10 forms the sum $A_4 + A_3$ and hence the divisor.

Figure 5:
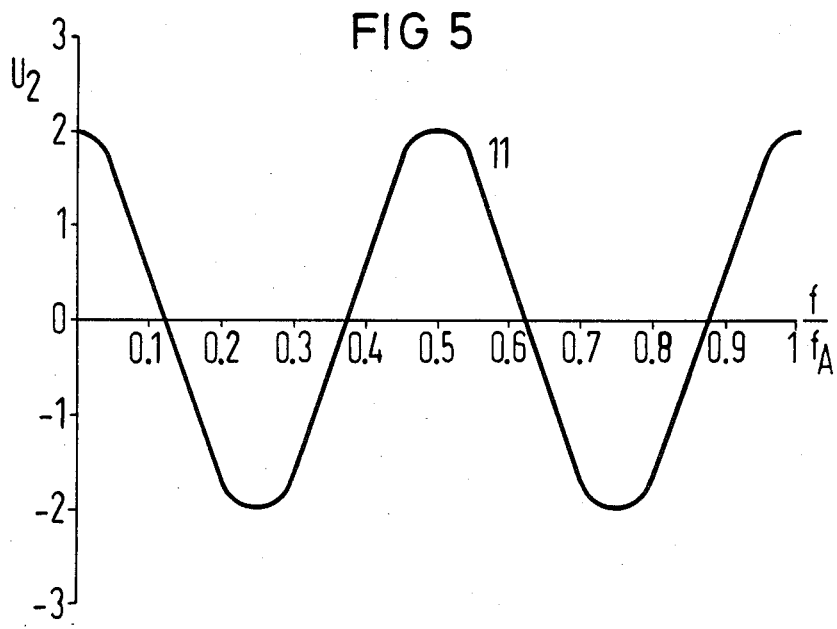
FIG. 5 is a graph of a demodulation characteristic of the demodulator operating according to the apparatus of FIG. 4.

FIG. 5 shows the demodulation characteristic 11 of the embodiment shown in FIG. 4 for a demodulator according to the invention, the axes being suitably normalized. The characteristic 11 is determinable by analysis or measurement. On the x-axis, the instantaneous frequency f of the FM signal to be demodulated is plotted, referenced to the clock frequency $f_A$ ($f_A = 1/T_A$). The demodulated signal $U_2$ is indicated on the y-axis. The demodulation characteristic 11 has a cosine form which, in a relatively large zone in the vicinity of the zero crossings, presents only minor non-linearities, so that in these zones the output signal $U_2$ of the divider D is directly proportional to the instantaneous frequency f of the input signal $U_1$. If the intention is to operate in the non-linear zone of the characteristic, the characteristic can be linearized e.g. by means of a read-only memory programmed accordingly.

When amplitude weighted sums of samples differing from this embodiment for the dividend and for the divisor, e.g. those given in the examples above, then the number of delay elements, the placement of the adders or adding stages, and possibly the configurations for the formation of weighting factors must be changed accordingly. At low clock frequencies $T_A$, the divider D can be provided in the form of a commercially available arithmetic unit. For higher clock frequencies it is advisable to replace the divider D by a read-only memory in which the magnitudes of the earlier computed division results are stored according to the magnitude of the dividend and divisor.

A special advantage of the method according to the invention is the flexible selection of the usable samples and the fact that the unknown phase relationship between sampling frequency and FM signal to be demodulated need not be taken into consideration.

The method according to the invention can be used in particular for the demodulation of frequency-modulated stereophonic radio signals and in digitally operating color television receivers for demodulating the chrominance signal present in the SECAM system in frequency-modulated form.

It can also be advantageously used in all data transmission and storage methods which operate with frequency shift keying (FSK).

I claim:

1. Method for demodulating a frequency-modulated signal, wherein said frequency-modulated signal is sampled at equidistant discrete times and several first and second sampled values are added to form first and second vector sums respectively, whereby the selection of the first and second sample values is made under the condition that in a mathematical vector representation of these sample values the difference in phase between the first and second vector sum is n times pi wherein n is any integer, and wherein, for obtaining an output signal which is proportional to the instantaneous frequency of the signal in the region of zero crossings the first vector sum is divided by the second vector sum.

2. Apparatus for demodulating a frequency-modulated signal wherein said frequency-modulated signal is sampled at equidistant discrete times, the apparatus comprising a series circuit to which the signal to be demodulated is applied, the series circuit, which includes delay elements, causing a constant phase-shift at first connection points for forming the first vector sum of sample values with first adders, and at second connection points for forming the second vector sum of sample values with a second adder, and a divider to which the outputs of both adders are conducted.

3. Apparatus according to claim 2, wherein the divider comprises a read-only memory in which the division results are stored and which can be addressed by said first and second sums.

4. Apparatus according to claim 3, wherein the divider comprises a read-only memory in which the division results and the respective associated inverse cosine functions are stored and which can be addressed by said first and second sums.

* * * * *